United States Patent [19]

Meyer

[11] Patent Number: 4,616,193
[45] Date of Patent: Oct. 7, 1986

[54] HIGH FREQUENCY TRANSISTOR OSCILLATOR WITH DISCRETE RESONATOR ELEMENTS FOR TRANSPONDER

[75] Inventor: Walter Meyer, Sparks, Nev.

[73] Assignee: Northern Illinois Gas Company, Aurora, Ill.

[21] Appl. No.: 693,208

[22] Filed: Jan. 22, 1985

[51] Int. Cl.$^4$ .......................... H03B 1/04; H03B 5/08
[52] U.S. Cl. .............................. 331/105; 331/117 FE; 331/177 V
[58] Field of Search ............ 331/105, 117 R, 117 FE, 331/176, 177 V; 332/30 V; 375/62, 65; 455/4, 31, 32, 38, 73, 84, 89

[56] References Cited

U.S. PATENT DOCUMENTS

| | | | |
|---|---|---|---|
| 2,137,265 | 11/1938 | Buschbeck | 331/105 |
| 3,436,681 | 4/1969 | Hart | 331/117 |
| 3,723,905 | 3/1973 | Sterner | 331/109 |
| 4,003,000 | 1/1977 | Sordello et al. | 331/117 R |
| 4,103,259 | 7/1978 | Lindner | 331/117 D |
| 4,146,850 | 3/1979 | Fache et al. | 331/117 R |
| 4,189,688 | 2/1980 | Sechi et al. | 331/117 FE |
| 4,247,908 | 1/1981 | Lockhart, Jr. et al. | 455/31 X |

FOREIGN PATENT DOCUMENTS 0110990 5/1964 Czechoslovakia .................. 331/117

Primary Examiner—Eugene R. LaRoche
Assistant Examiner—D. C. Mis
Attorney, Agent, or Firm—Emrich & Dithmar

[57] ABSTRACT

A solid state oscillator circuit for operation at very high frequencies includes a field effect transistor having an input network connected between its gate and source electrodes and an output network connected between its drain and source electrodes, the input and output networks each including three discrete capacitors connected in a "pi" configuration, the input and output networks being connected in series with one another, and an inductor being connected in parallel with the series connected networks, the equivalent circuit impedance of the networks in series and the inductance determining the operating frequency of the oscillator circuit, and the relative ratio of impedance of the networks determining the amount of oscillator feedback.

16 Claims, 3 Drawing Figures

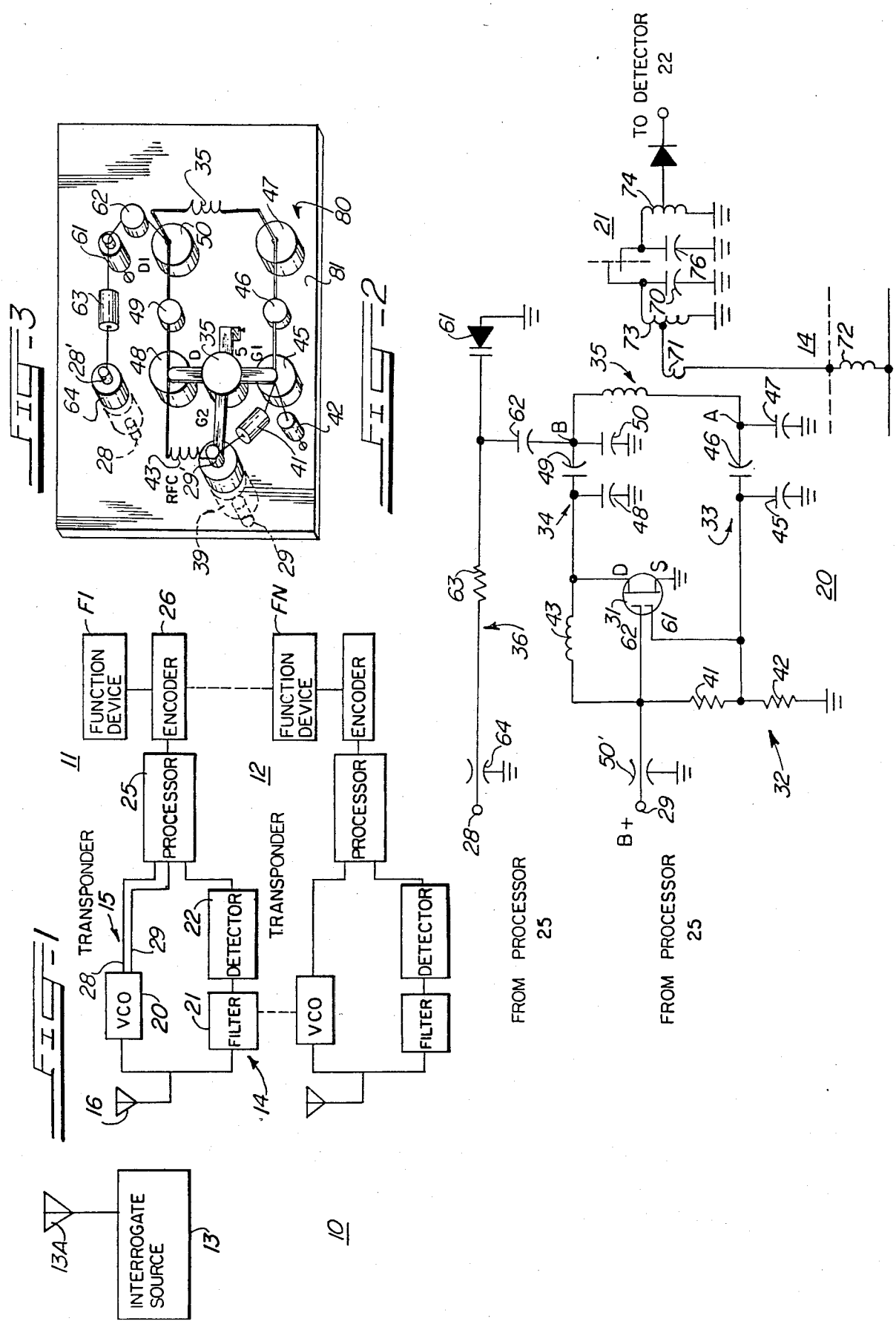

4,616,193

HIGH FREQUENCY TRANSISTOR OSCILLATOR WITH DISCRETE RESONATOR ELEMENTS FOR TRANSPONDER

BACKGROUND OF THE INVENTION

This invention relates to oscillator circuits, and more particularly, to a very high frequency oscillator circuit exhibiting improved stability.

The highest frequency of oscillation of a semiconductor oscillator is theoretically limited only by the characteristics of the semiconductor device that is used in the oscillator circuit. However, in practice, many other constraints apply. One such constraint is the inability to physically construct a circuit that can meet the circuit constants needed to support the desired frequency of oscillation. In many cases, it is impractical to fabricate the main inductive frequency determining element to a low enough value to satisfy the resonant frequency equations. Another problem concerns itself with minimizing the series inductance of the various capacitive and other circuit elements. If these unavoidable parasitic inductive elements are not small enough compared to the main frequency determining inductance, then unstable or unpredictable operation results.

Another problem with high frequency oscillator operation is that circuit capacitances must be reduced as the operating frequency is increased. The limiting case is usually when all capacitances are eliminated until only the semiconductor internal capacitances and the unavoidable stray capacitances remain. Under these conditions, the circuit is unstable with changes in temperature or/and supply voltage as no temperature compensating elements are present. It is improbable that device to circuit match or that feedback would be optimum.

It would be desirable then to have a high frequency oscillator circuit having a high enough frequency determining inductance to allow repeatable fabrication. It would further be desirable to have very high frequency oscillator characterized by a high ratio of main inductance to parasitic circuit inductance. It would also be desirable to have a very high frequency oscillator which enables compensation for temperature changes in circuit operation, and which is characterized by the capability of adjusting circuit feedback and circuit match to both the input and output ports of the active element of the oscillator circuit.

SUMMARY OF THE INVENTION

The present invention provides a solid state oscillator circuit for operation at very high frequencies, said oscillator circuit comprising an active element having an input port and an output port, bias means connected to a control electrode of said active element for establishing the operating point for said active element; an inductance; an input network coupling said inductance to said input port of said active semiconductor element; an output network coupling said inductance to said output port of said active element; said input and output networks each including a plurality of discrete capacitive elements, said input and output networks being connected in series with one another, and said inductance being connected in parallel with said series connected input and output networks, whereby the equivalent circuit impedance of said input and output networks in series and said inductance determine the operating frequency of the oscillator circuit, and the relative ratio of impedance of the input and output networks determining the amount of oscillator feedback.

In accordance with the invention, the use of a plurality of discrete capacitors enable selection of almost any desired degree of feedback match and ratio of circuit inductance to capacitance. Moreover, the temperature coefficients of the capacitors of the two networks are selected to compensate for individual input and output temperature characteristics of the active element.

In accordance with a further aspect of the invention, the circuit construction lends itself to improved physical construction providing for low series inductance of the matching frequency determining capacitances, for example. Moreover, the circuit is capable of operating with a high degree of stability at a very low voltage in the order of 3 volts with low frequency shift. Frequency shifts are in the order of or less than 1% at an operating range of over 400 MHz.

DESCRIPTION OF THE DRAWINGS

FIG. 1 is a block diagram of a data transmission system including a transponder which incorporates the high frequency oscillator circuit provided in accordance with the present invention;

FIG. 2 is a schematic circuit diagram of the high frequency oscillator circuit provided by the present invention; and FIG. 3 is a simplified representation of a physical construction of the oscillator circuit.

DESCRIPTION OF THE PREFERRED EMBODIMENTS

Referring to FIG. 1, the oscillator circuit of the present invention is described with reference to an application in a data transponder in a data transmission system 10. In such system, a plurality of data transponders are provided, each associated with a different data source, such as transponder 11 for data source F1, transponder 12 for data source Fn, etc. The data transmission system provides automatic readout of data which is provided by the data sources F1, . . . Fn, which may be data indicating devices such as registers of utility meters, business machines, etc.

A radio link is established between the transponders 11, 12 and an interrogate source 13 which may be fixed or located within a mobile vehicle. The interrogate source 13 transmits an interrogate signal to the transponders, and each transponder responds to the interrogate signal to generate a reply signal representing, for example, the current reading of the register of its associated functional device and transmit the reply signal back to the interrogate source 13. The interrogate signal is coded to represent a unique serial number or address for each of the transponders to permit selected readout of the information registered by the associated functional device.

Each transponder, such as transponder 11, comprises a receiver 14 and a transmitter 15 both which are diplexed to an antenna 16. The transmitter 15 includes the oscillator 20 circuit provided by the present invention. The receiver 14 includes a bandpass filter 21 and a detector 22. The transponder also includes a processor 25 which interfaces the transmitter 15 and receiver 14 with an encoder 26 associated with the functional device F1, and the processor controls the operation of the transponder including verification of the incoming interrogate signal and enabling of the transmitter to operate in the transmission of the data provided by functional device F1.

In the transponder receiver 14, the bandpass filter 21 has its input connected to the antenna 16 and its output connected to the detector 22. The bandpass filter 21 defines the response frequency band for the receiver 16 which is centered at 451 MHz in the exemplary embodiment. The oscillator 20 of the transmitter is operated at a voltage controlled oscillator having a center frequency of 414 MHz in this example. This signal is FM modulated with a binary encoded FSK signal supplied over input 28 by the processor 25 as a modulating drive signal for the voltage controlled oscillator 20 representative of the data to be transmitted to the interrogate source 13. The processor 25 also activates the transmitter, extending a bias voltage B+ to input 29.

Briefly, in operation, each transponder is assigned a serial number or address which allows it to be uniquely addressed by the interrogate source 13. The interrogate source generates an interrogate signal by amplitude modulating the 451 MHz transmitter carrier with a digital code signal to represent the address of the transponder to be interrogated. The receiver 14 detects the incoming amplitude modulated signal, recovering the low frequency digital information.

The processor 25 processes the incoming digital signals and when a valid interrogate signal is received and the received serial number code corresponds to that assigned to the transponder, the processor 25 controls the transmitter 15 in transmitting the reading of the register associated with the data source F1. The transmitter 15 replies with a 414 MHz carrier modulated with a binary encoded FSK signal. Modulation frequencies of 45.45 kHz and 50.00 kHz are used to represent binary values of "0" and "1", respectively, with each bit having a 360 microsecond duration.

Referring now to FIG. 2, the oscillator circuit 20 of the present invention will now be described. The oscillator circuit 20 includes an active element 31 embodied as a dual-gate MOSFET 31 having an associated bias network 32, an input network 33 and an output network 34. The oscillator circuit further includes a tuning stage 35 and a modulating input stage 36. The MOSFET 31 may be the type BF-960 double gate MOSFET, commercially available from Seimens.

The bias network 32, sets the operating point for the MOSFET 31 and includes resistors 41 and 42 which are connected in series between the DC power input B+ and a point of reference potential. In accordance with a feature of the invention, the DC bias voltage may be low level, 4 volts in this embodiment. The junction of the two resistors 41 and 42 is connected to the gate electrode G1 of the MOSFET 31 which has its other gate electrode G2 connected directly to receive bias B+ over input 29 when activated by the processor 25. The MOSFET 31 has its source electrode 55 connected to the point of reference potential and its drain electrode connected through high frequency choke inductor 43 to B+ input. Inductor 43 isolates the high frequency signals from the DC bias source.

Input network 33 comprises three capacitors 45, 46 and 47 which are connected as a "pi-network" between gate G1 of the MOSFET and point A. Capacitor 46 also prevents the application of the positive supply voltage directly to the gate G1.

The output network 34 comprises three capacitors 48, 49 and 50 which are connected as a "pi-network" between the drain electrode D of the MOSFET 31 and point B. An inductor 35 is connected between points A and B and is thus coupled to the input and output circuits of the MOSFET 31 through networks 33 and 34.

The equivalent circuit impedance of the input and output networks 33, 34, in series (point A to point B) in conjunction with inductor 35 determines the frequency of oscillation which is 414 MHz in the exemplary embodiment.

In addition, the values of capacitors 45–47 of the input network 33 are selected to effect the desired degree of match between the input of the MOSFET 31 and the tank inductance provided by inductor 35. Similarly, the values of capacitors 48–50 of the output network 35 are selected to effect the desired degree of match between the output of the MOSFET 31 and the tank inductance. Capacitor 45, which is connected between gate G1 and the point of reference potential, parallels the input capacitance (gate-to-source) of the MOSFET 31. Capacitor 48, which is connected between the drain D, the point of reference potential, parallels the output capacitance (drain-to-source) of the MOSFET 31. The input network 33 defines the feedback path for the oscillator circuit.

As indicated above, in operation, the 414 MHz base frequency is frequency modulated with a binary encoded signal using modulating frequencies of 45.45 kHz and 50.00 kHz to represent logic "0" and logic "1", respectively.

The modulating circuit 36 includes a varactor diode 61, a capacitor 62 and a resistor 63. The varactor diode 61 may be the type BB105B, commercially available from Seimens. The varactor diode 61 is connected in series with capacitor 62 between the point of reference potential and the junction of inductor 35 and the output network 36 at point B, and through resistor 63 to the modulating drive input terminal 28, the source of modulating signals provided by the processor 25.

Capacitor 62 decouples the DC bias for the oscillator circuit from the varactor diode 61. In transmission operation, the processor 25 provides a serial pulse train to modulating drive input 28 and thus to varactor diode 61 varying the junction capacitance of the varactor diode 61 causing the oscillator frequency to vary, providing frequency modulation indicative of the data provided by the data source F1 via its encoder 26 and the processor 25 (FIG. 1).

The output of the oscillator circuit 20 is coupled to the antenna 16 through a coupling coil 71 which is connected to the antenna through a load coil 72. The coupling coil 71 also connects to a tap of the receiver input coil 73 which operates as an auto transformer, coupling the interrogate source 13 interrogate signals to the receiver. The output of the coil 73 is coupled to a detector coil 74 which couples the incoming signal to the input of diode detector 22. Capacitors 75 and 76 comprise a filter circuit for the antenna input circuit to the receiver.

In the oscillator circuit 20, the values of the six capacitances 45–50 can be selected to provide almost any desired degree of feedback, match, and L/C ratio. Also, of equal importance, the temperature coefficients of the six capacitances 45–50 can be selected to compensate for the individual input and output temperature characteristics of the MOSFET 31, the feedback versus temperature requirements of the oscillator circuit, and the temperature characteristics of the remaining circuit elements including inductor 35.

The value and temperature coefficient of capacitor 62 of the modulating network 36 is chosen to adjust the capacitance versus control voltage characteristic and the capacitance versus temperature characteristic of the network. Furthermore, the selection of capacitors 45–50 can be made to obtain the desired frequency versus temperature versus control voltage characteristics. The varactor diode network shown connected from point B to ground, could also be connected from point A to ground, or from point A to point B.

In one oscillator circuit constructed and operated in accordance with the present invention, the electrical elements had the following values:

capacitor 45: 4.7 picofarads
capacitor 46: 2.7 picofarads
capacitor 47: 4.7 picofarads
capacitor 48: 4.7 picofarads
capacitor 49: 4.7 picofarads
capacitor 50: 4.7 picofarads
capacitor 62: 2.2 picofarads resistor 41: 47K ohms
resistor 42: 10K ohms
resistor 63: 10K ohms
inductor 35: 0.04 microhenries
inductor 43: 0.03 microhenries In a realization of the oscillator circuit having the component values indicated above, operating at a center frequency of approximately 414 MHz, the following results were achieved:

|  | Low | Medium | High |
| --- | --- | --- | --- |
| Bias (vdc) | +3.0 | +4.0 | +4.5 |
| Center frequency (MHz) | 413.947 | 414.085 | 414.136 |
| 20 DB BW at 50 kHz (MHz) | .95 | 1 | 1.02 |
| CW output into 30 ohms (dbm) | −5 | −1 | 1.02 |
| Mod. output into 30 ohms (dbm) | −14 | −9.5 | −8 |

The frequency drift was in the order of 100 kHz for a 75° temperature rise from the ambient level. The frequency as the result of variation in the bias supply in the range of 3 volts to 4.5 volts, was 189 kHz.

In accordance with a further feature of the invention, the described circuit lends itself to improved physical construction so that the above characteristics can be obtained in a practical manner. Referring to FIG. 3, capacitors 45, 47, 48 and 50 are metalized disc capacitors which are soldered directly to the upper surface 81 of a supporting metallic ground plane 80 and positioned at four corners of a rectangle. The MOSFET 31 is mounted on the ground plane 80 between capacitors 48 and 45 with its drain D and gate G1 leads connected to capacitors 48 and 45, respectively, its sources soldered to the ground plane and its gate G2 connected to a terminal 29' on one side of shielded conductor 30 which extends through the ground plane locating bias input terminal 29 at the backside of the ground plane 80. Resistor 41 is connected between terminal 29' and capacitor 45 and resistor 42 is connected between capacitor 45 and the ground plane.

Capacitors 46 and 49 are small disc type capacitors with their leads connected between respective capacitors 45 and 47 and 48 and 50. Inductor 35 is connected between points A and B, in parallel with capacitors 47 and 50, and the hf choke oil 43 is connected between capacitor 48 and terminal 29'. Diode 61 has its anode soldered to the ground plane 80. Capacitor 62, which is a small disc capacitor, is connected between the cathode of varactor diode 61 and capacitor 50. Resistor 63 is connected between the cathode of varactor diode 61 and a terminal 28' of shielded conductor 64 which extends through the ground plane and locates modulating drive input terminal 28 at the backside thereof.

This physical construction provides for very low series inductance of the matching and frequency determining capacitances as well as convenient physical mounting points for the MOSFET 31 and the inductor 35. In addition, this construction controls the location of capacitors 45, 47, 48 and 50 providing a circuit configuration characterized by repeatable fabrication.

I claim:

1. A solid state oscillator circuit for operation at very high frequencies, said oscillator circuit comprising: an active element having an input port and an output port; bias means connected to a control electrode of said active element for establishing the operating point for said active element; an inductance; an input network coupling said inductance to said input port of said active semiconductor element; an output network coupling said inductance to said output port of said active element; said input and output networks each including a plurality of discrete capacitive elements, first capacitive elements of said input and output networks being connected in parallel with said input and output ports, respectively, second capacitive elements of said input and output networks coupling respective first and second terminals of said inductance to said input and output ports, respectively, and third capacitive elements of said input and output networks being connected in series with one another and in parallel with said inductance and in parallel with said first and second capacitive elements of said input and output networks defining a tuned circuit which is connected between said output and input ports of said element and which determines the operating frequency for the oscillator circuit and provides a signal feedback path between said output port and said input port, the relative ratio of impedance of the input and output networks determining the amount of oscillator feedback provided for the output port to the input port.

2. An oscillator circuit according to claim 1, wherein said active element comprises a dual-gate metal oxide semiconductor field effect transistor, with said input network being connected to a first gate electrode and the source electrode of said field effect transistor, and said output network being connected to the drain electrode and the source electrode of said field effect transistor.

3. An oscillator circuit according to claim 1, further comprising a metallic ground plane defining a plane of reference potential including said point of reference potential, first and second capacitive elements of said input network and first and second capacitive elements of said output network each being a metalized disc capacitor each having a first side electrically connected to said ground plane and a second side, the second sides of said capacitors defining mounting and connection points for at least said active element and said inductance.

4. An oscillator circuit according to claim 1, further comprising variable reactance means for varying the frequency of oscillation of the oscillator circuit.

5. An oscillator circuit according to claim 4, wherein said variable reactance means is connected to one of said networks to vary to equivalent circuit impedance of said networks thereby varying the frequency of oscillation of the circuit.

6. An oscillator circuit according to claim 5, wherein said variable reactance means comprises a varactor diode and a source of a modulating signals for application to said varactor diode.

7. A solid state oscillator circuit for operation at very high frequencies, said oscillator circuit comprising: a semiconductor element having an input port and an output port; bias means for establishing the operating point for said semiconductor element; an inductance; an input network coupling said inductance to said input port of said semiconductor element; and an output network coupling said inductance to said output port of said semiconductor; said input and output networks each including a plurality of discrete capacitive elements connected in a "pi" configuration, said input network having a first terminal and a second terminal, a first capacitor interconnecting said first and second terminals, a second capacitor connected between said first terminal and a point of reference potential, and a third capacitor connected between said second terminal and said point of reference potential; said output network having a third terminal and a fourth terminal, a fourth capacitor interconnecting said third and fourth terminals, a fifth capacitor connected between said third terminal and said point of reference potential and a sixth capacitor connected between said fourth terminal and said point of reference potential, said inductance being connected between said first and third terminals and said second and fourth terminals being connected to a control electrode and an output electrode, respectively of said semiconductor element.

8. A solid state oscillator according to claim 7, wherein said semiconductor element comprises a dual-gate MOS field-effect transistor.

9. An oscillator circuit for operation at very high frequencies, said oscillator circuit comprising: an active element having an input port and an output port; an inductance, a first network including a plurality of discrete capacitive elements; a second network including a plurality of discrete capacitive elements connected in series with said first network, and said inductance connected in parallel with said series connected networks defining a tuned circuit which is connected between said output and input ports of said active element providing a signal feedback path therebetween; said inductance and said first and second networks determining the frequency of oscillation of the oscillator circuit; and a metallic ground plane defining a plane of reference potential for the oscillator circit, first and second capacitive elements of said first network and first and second capacitive elements of said second network each being a metalized disc capacitor having a first side electrically connected to said ground plane and having second sides which define mounting and connection points for at least said active element and said inductance.

10. In a system for obtaining information from a remotely located data source, including an interrogate source and a transponder associated with the data source, the interrogate source transmitting an interrogate signal over an RF link for effecting the readout of the data source by addressing its transponder, the transponder including receiver means for receiving the interrogate signal, signal processing means responsive to the receipt of an interrogate signal to generate a transmit command; and transmitter means responsive to said transmit command to transmit the information provided by the data source, said transmitter means comprising: a solid state oscillator circuit including an active semiconductor element having an input port and an output port; bias means connected to a control electrode of said active element for establishing the operating point for said active element; an inductance; an input network coupling said inductance to said input port of said active element, an output network coupling said inductance to said output port of said active element, said input and output networks each including a plurality of discrete capacitive elements, first capacitive elements of said input and output networks being connected in parallel with said input and output ports, respectively, second capacitive elements of said input and output networks coupling respective first and second terminals of said inductance to said input and output ports, respectively, and third capacitive elements of said input and output networks being connected in series with one another and in parallel with said inductance and in parallel with said first and second capacitive elements of said input and output networks, defining a tuned circuit which is connected between said input and output ports of said active element and which determines the operating frequency for the oscillator circuit and provides a signal feedback path from said output port to said input port, the equivalent circuit impedance of said input and output networks in series and said inductance determining the level of the oscillator feedback signal from said output port to said input port.

11. A system according to claim 10, wherein said active element comprises a dual-gate metal oxide semiconductor field effect transistor, with said input network being connected to a first gate electrode and the source electrode of said field effect transistor, and said output network being connected to the drain electrode and the source electrode of said field effect transistor.

12. A system according to claim 11, wherein said transmitter means comprises variable reactance means connected to said oscillator circuit and controlled by said processor means for varying the frequency of oscillation of the oscillator circuit, frequency modulating the signal output of said transmitter means in accordance with data to be transmitted.

13. A system according to claim 12, wherein said variable reactance means comprises a varactor diode connected to one of said networks to vary the equivalent circuit impedance of said networks thereby varying the frequency of oscillation of the circuit.

14. A system according to claim 10, wherein said processor means is effective to activate said transmitter means for transmitting data only in response to receipt of an interrogate signal.

15. A solid state oscillator circuit for operation at very high frequencies, said oscillator circuit comprising: an active element having an input port and an output port; bias means connected to a control electrode of said active element for establishing the operating point for said active element; an inductance; an input network coupling said inductance to said input port of said active semiconductor element; an output network coupling said inductance to said output port of said active element; said input and output networks each including a plurality of discrete capacitive elements, said input and output networks being connected in series with one another, and said inductance being connected in parallel with said series connected input and output networks, said capacitive elements of said input network connected in a "pi" configuration and having an output terminal and a reference terminal connected to said control electrode and a point of reference potential, respectively, with one of the capacitive elements of said input network connected in parallel with said input port, and said capacitive elements of said output network connected in a "pi" configuration and having an input terminal and a reference terminal connected to an output electrode of said active element and said point of reference potential, respectively, with one of said capacitive elements of said output network connected in parallel with said output port, and said inductance connected between an output terminal of said output network and an input terminal of said input network, the equivalent circuit impedance of said input and output networks in series and said inductance determining the operating frequency of the oscillator circuit.

16. In a system for obtaining information from a remote located data source, including an interrogate source and a transponder associated with the data source, the interrogate source transmitting an interrogate signal over an RF link for effecting the readout of the data source by addressing its transponder, the transponder including receiver means for receiving the interrogate signal, signal processing means responsive to the receipt of an interrogate signal to generate a transmit command; and transmitter means responsive to said transmit command to transmit the information provided by the data source, said transmitter means comprising: a solid state oscillator circuit including an active semiconductor element having an input port and an output port; bias means connected to a control electrode of said active element for establishing the operating point for said active element; an inductance; an input network coupling said inductance to said input port of said active element, an output network coupling said inductance to said output port of said active element, said input and output networks each including a plurality of discrete capacitive elements, said input and output networks connected in series with one another, and said inductance connected in parallel with said series connected input and output networks, said capacitive elements of said input network connected in a "pi" configuration and having an output terminal and a reference terminal connected to said control electrode and a point of reference potential, respectively, with one of the capacitive elements of said input network being connected in parallel with said input port, and said capacitive elements of said input network are connected in a "pi" configuration and having an input terminal and reference terminal connected to an output electrode of said active element and said point of reference potential, respectively, with one of said capacitive elements of said output network connected in parallel with said output port, and said inductance connected between an output terminal of said output network and an input terminal of said input network the equivalent circuit impedance of said input and output networks in series and said inductance determining the operating frequency of the oscillator circuit.

* * * * *

UNITED STATES PATENT AND TRADEMARK OFFICE
CERTIFICATE OF CORRECTION

PATENT NO. : 4,616,193
DATED : October 7, 1986
INVENTOR(S) : Walter Meyer

It is certified that error appears in the above—identified patent and that said Letters Patent is hereby corrected as shown below:

Column 6, line 43, change "for" to --from--;

Column 7, line 1, after "vary", change "to" to --the--;

Column 9, lines 18 and 19, change "remote" to --remotely--; and

Column 10, line 27, after "network" insert --,--.

Signed and Sealed this

Third Day of February, 1987

*Attest:*

DONALD J. QUIGG

*Attesting Officer*   *Commissioner of Patents and Trademarks*